United States Patent
Kurosawa

(10) Patent No.: US 7,140,951 B2
(45) Date of Patent: Nov. 28, 2006

(54) SEMICONDUCTOR DEVICE MANUFACTURING APPARATUS AND SEMICONDUCTOR DEVICE MANUFACTURING METHOD FOR FORMING SEMICONDUCTOR CHIPS BY DIVIDING SEMICONDUCTOR WAFER

(75) Inventor: Tetsuya Kurosawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 393 days.

(21) Appl. No.: 10/385,505

(22) Filed: Mar. 12, 2003

(65) Prior Publication Data

US 2004/0137699 A1    Jul. 15, 2004

(30) Foreign Application Priority Data

Jan. 10, 2003    (JP) .............................. 2003-004618

(51) Int. Cl.
*H01L 21/46* (2006.01)
(52) U.S. Cl. ......................................... 451/54; 438/460
(58) Field of Classification Search ................ 438/464, 438/460, 463, 963; 451/28, 41, 54, 57, 388; 219/121.6
See application file for complete search history.

(56) References Cited

U.S. PATENT DOCUMENTS

| | | | |
|---|---|---|---|
| 4,722,130 A | 2/1988 | Kimura et al. | |
| 5,605,489 A * | 2/1997 | Gale et al. | ..................... 451/28 |
| 6,426,275 B1 | 7/2002 | Arisa | |
| 6,534,386 B1 * | 3/2003 | Irie | .............................. 438/464 |
| 2001/0001078 A1 * | 5/2001 | Nakabayashi | ................ 438/458 |
| 2002/0192927 A1 | 12/2002 | Yamada | |
| 2002/0197770 A1 | 12/2002 | Irie | |
| 2003/0205221 A1 * | 11/2003 | Leu | .......................... 125/13.01 |
| 2004/0026382 A1 * | 2/2004 | Richerzhagen | ............ 219/121.6 |

FOREIGN PATENT DOCUMENTS

| | | |
|---|---|---|
| EP | 1 022 778 A1 | 7/2000 |
| EP | 1 026 735 A2 | 8/2000 |
| EP | 1 195 809 A2 | 4/2002 |
| GB | 2 007 429 A | 5/1979 |
| JP | 55-003607 | 1/1980 |
| JP | 60-55640 | 3/1985 |
| JP | 07-283179 | 10/1995 |
| JP | 10-144631 | 5/1998 |
| JP | 11-040520 | 2/1999 |
| JP | 3024384 | 1/2000 |
| JP | 2001-127013 | 5/2001 |

OTHER PUBLICATIONS

Notification of Reasons for Rejection (Office Action) for Japanese Patent Application No. 2003-004618, mailed Nov. 22. 2005 and English translation thereof.

* cited by examiner

*Primary Examiner*—Jacob K. Ackun, Jr.
(74) *Attorney, Agent, or Firm*—Finnegan, Henderson, Farabow, Garrett & Dunner, L.L.P.

(57) ABSTRACT

An apparatus for manufacturing a semiconductor device includes a first affixing mechanism, cutting mechanism, a second affixing mechanism and peeling mechanism. The first affixing mechanism affixes a first holding member to a rear surface of a semiconductor wafer which is opposite to an element forming surface thereof. The cutting mechanism cuts and discretely divides the semiconductor wafer. The second affixing mechanism affixes a second holding member to the element forming surface side of the semiconductor wafer while the first holding member is expanded to widen gaps of semiconductor elements of the discretely divided semiconductor wafer. The peeling mechanism peels the first holding member.

17 Claims, 11 Drawing Sheets

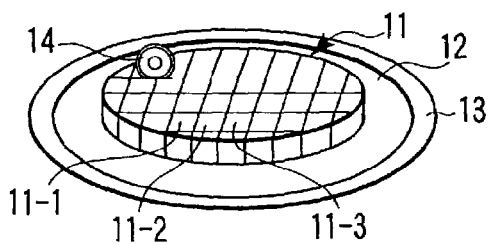
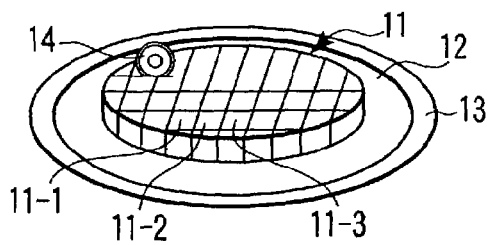
FIG. 1 PRIOR ART
FIG. 3 PRIOR ART
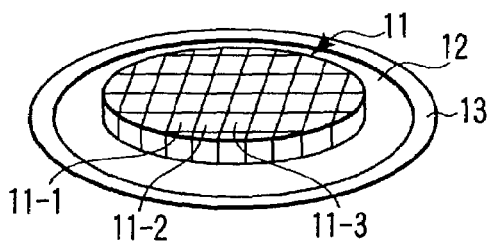
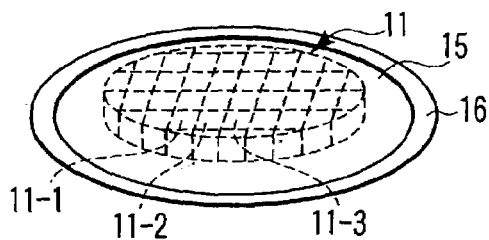
FIG. 2 PRIOR ART
FIG. 4 PRIOR ART
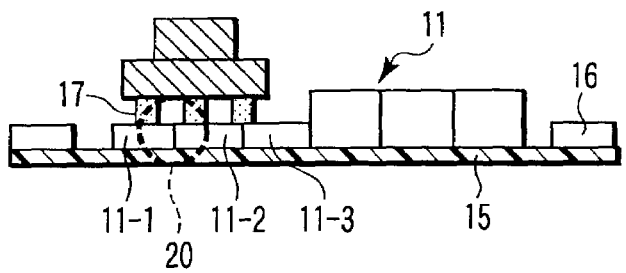
FIG. 5 PRIOR ART
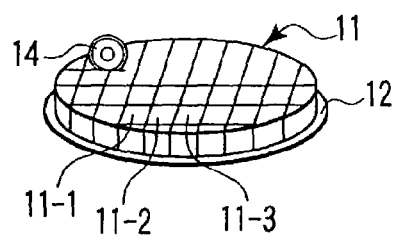
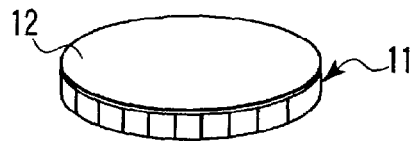
FIG. 6 PRIOR ART
FIG. 7 PRIOR ART

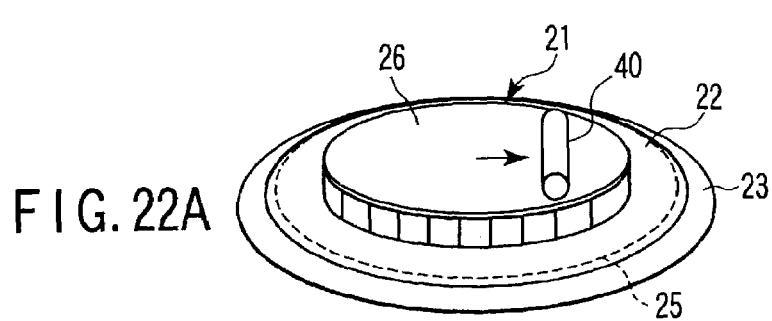
FIG. 22A
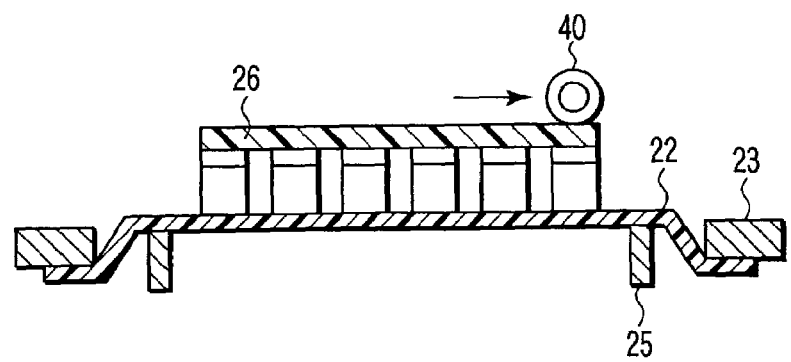
FIG. 22B
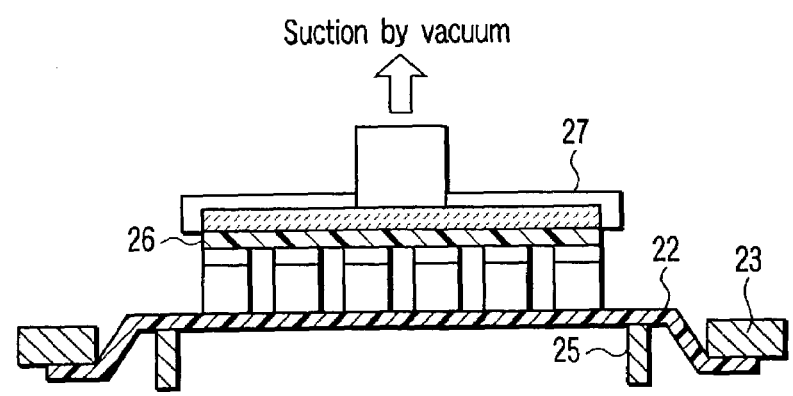
FIG. 23
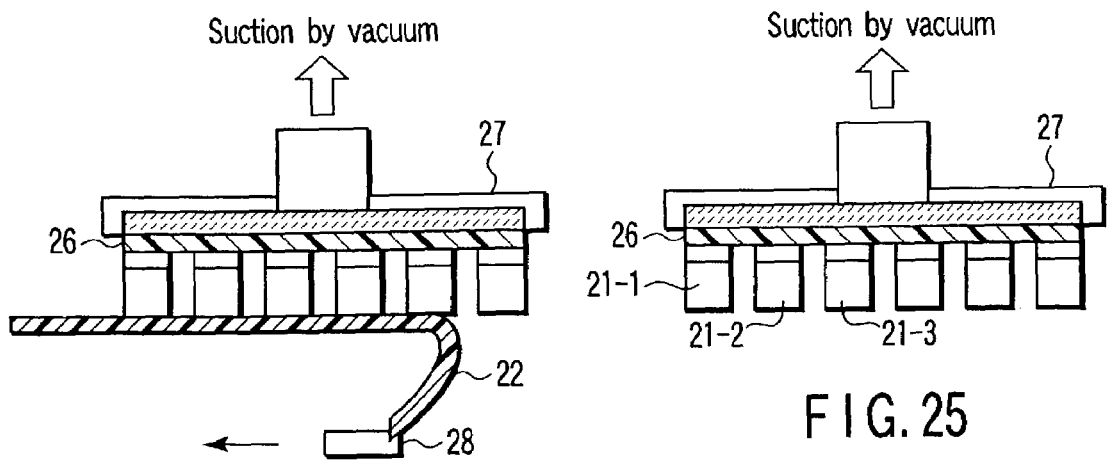
FIG. 24
FIG. 25

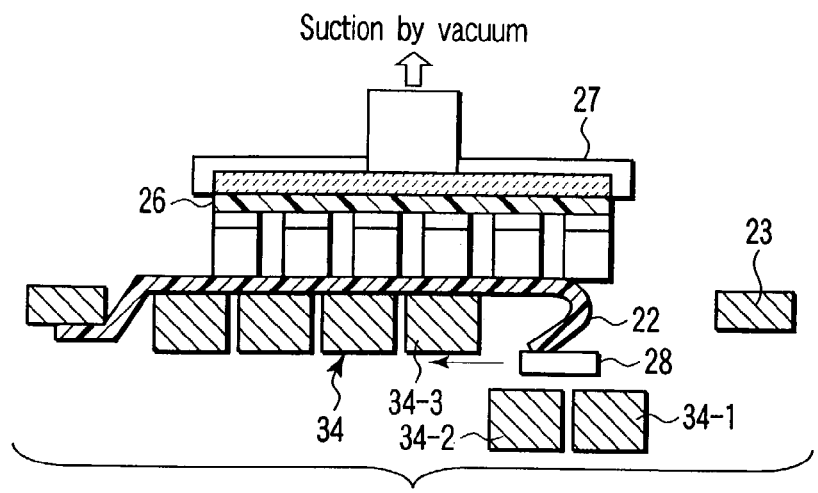
F I G. 36
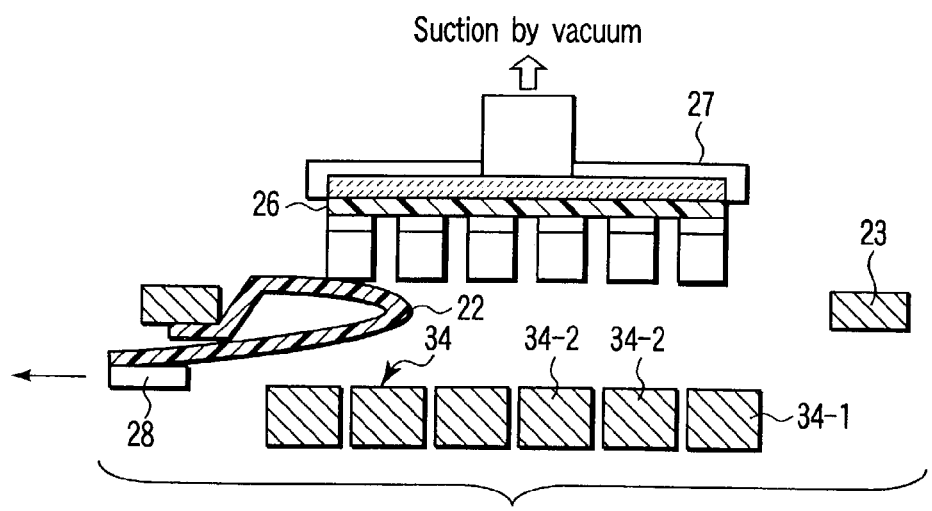
F I G. 37
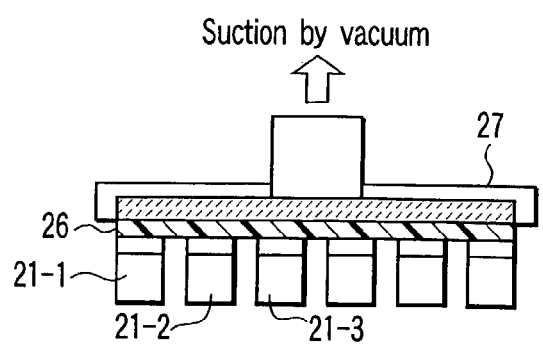
F I G. 38

SEMICONDUCTOR DEVICE MANUFACTURING APPARATUS AND SEMICONDUCTOR DEVICE MANUFACTURING METHOD FOR FORMING SEMICONDUCTOR CHIPS BY DIVIDING SEMICONDUCTOR WAFER

CROSS-REFERENCE TO RELATED APPLICATIONS

This application is based upon and claims the benefit of priority from the prior Japanese Patent Application No. 2003-004618, filed Jan. 10, 2003, the entire contents of which are incorporated herein by reference.

BACKGROUND OF THE INVENTION

1. Field of the Invention

This invention relates to a semiconductor device manufacturing apparatus and semiconductor device manufacturing method for forming semiconductor elements (semiconductor chips) by dividing a semiconductor wafer. More particularly to an affixing technique for adhesive tapes when the semiconductor wafer is divided.

2. Description of the Related Art

Conventionally, the process for forming semiconductor elements (semiconductor chips) by dividing a semiconductor wafer is performed according to the steps shown in FIGS. 1 and 2, for example. First, as shown in FIG. 1, an adhesive tape (holding tape) 12 is affixed to the rear surface of a semiconductor wafer 11 on which elements have been formed. The adhesive tape 12 has larger size than the semiconductor wafer 11 and is mounted on a wafer ring 13 so as to be easily handled when it is transferred or mounted on a manufacturing apparatus. Next, the semiconductor wafer 11 is divided into discrete semiconductor elements 11-1, 11-2, 11-3, . . . . In FIG. 1, a diamond blade 14 is used to divide the semiconductor wafer. However, the dividing method is not limited to a mechanically dividing method and can be attained by use of various methods of mechanical grinding and breaking (cleaving), scribing and breaking, application of laser beam, application of laser beam and breaking, and the like.

The semiconductor wafer 11 which is divided into the discrete semiconductor elements 11-1, 11-2, 11-3, . . . is transferred while it is held by the wafer ring 13 and adhesive tape 12 as shown in FIG. 2.

After this, the semiconductor elements 11-1, 11-2, 11-3, . . . are sequentially picked up from the adhesive tape 12 affixed to the rear surface of the semiconductor wafer 11. The picking-up process is performed while the adhesive tape 12 is expanded to widen gaps between the semiconductor elements 11-1, 11-2, 11-3, . . . or the picking-up process is performed without widening the gaps. After the thus picked-up semiconductor element is mounted on a lead frame or TAB tape, it is sealed into a resin or ceramic package to complete a semiconductor device.

When the semiconductor elements are made thin, the adhesive tape is peeled from the rear (or back-side) surface of the semiconductor wafer 11 and an adhesive tape is affixed to the front surface thereof as shown in FIG. 4 after the semiconductor wafer 11 is divided into the discrete semiconductor elements 11-1, 11-2, 11-3, . . . as shown in FIG. 3. The semiconductor wafer 11 which is held by an adhesive tape 15 and wafer ring 16 is transferred to and set on the table of a grinding attachment. Then, as shown in FIG. 5, the rear surface of the semiconductor wafer 11 is ground by use of a grindstone and polished by use of free adhesive grains or partly removed by etching or the like so that the semiconductor wafer will be made thin.

The above conventional manufacturing technique is described in Jpn. Pat. Appln. KOKAI Publication No. 11-40520 and Japanese Patent Specification No. 3024384, for example.

In this example, a case wherein the wafer ring 13 (and 16) is used is explained. However, it is also possible to cut and divide the wafer 11 while the wafer 11 is held only by use of the adhesive tape 12 without using the wafer ring 13 as shown in FIG. 6 and then transfer the wafer with the discrete semiconductor elements 11-1, 11-2, 11-3, . . . affixed to the adhesive tape 12 as shown in FIG. 7. Further, it is possible to grind the rear surface of the semiconductor wafer 11 while the wafer 11 is held only by use of the adhesive tape 15.

In recent years, in order to increase the number of semiconductor elements obtained from each semiconductor wafer, the width of lines at the time of dividing of the semiconductor wafer is made small. Further, it is required to make the thickness of finally obtained semiconductor elements extremely thin, for example, less than 100 µm and it is indispensable to suppress damages occurring when the semiconductor wafer is cut and discretely divided.

However, with the above conventional semiconductor device manufacturing apparatus and semiconductor device manufacturing method, the following problems occur.

First, if the cutting gaps are narrow when the semiconductor wafer is divided into discrete semiconductor elements, the semiconductor elements 11-1, 11-2, 11-3, . . . which are adjacent to one another interfere with one another at the transferring time as shown in FIGS. 8A and 8B. FIG. 8A shows stress applied at the transferring time and FIG. 8B shows an area surrounded by broken lines 18 in FIG. 8A. By the above interference, damages such as chippings 19A and scratches 19B occur on the front surface portion and side surface portion of the semiconductor element 11-1 as shown in FIG. 9. As a result, when a semiconductor device is formed by performing a pick-up process and mounting process after this, chip cracks will occur starting from the chippings 19A or scratches 19B and the semiconductor device will be defective.

Further, as shown in FIG. 10, at the back-side grinding time, discrete semiconductor elements 11-1, 11-2, . . . interfere with one another and damages such as chippings 19A and scratches 19B occur on the side surface portion and rear surface portion of the semiconductor elements 11-1, 11-2, . . . as shown in FIG. 11. Therefore, when a semiconductor device is formed as a product by performing a pick-up process and mounting process, chip cracks are more likely to occur, thereby lowering the quality and lowering the manufacturing yield.

Particularly, if a breaking (cleavage) method is used to divide the semiconductor wafer, substantially no gap is provided between the discrete semiconductor elements 11-1, 11-2, 11-3, . . . , and therefore, the above problem of occurrence of damages such as chippings and scratches due to interference between the semiconductor elements becomes significant.

BRIEF SUMMARY OF THE INVENTION

According to an aspect of the present invention, there is provided an apparatus for manufacturing a semiconductor device comprising a first affixing mechanism which affixes a first holding member to a rear surface of a semiconductor wafer which is opposite to an element forming surface thereof; a breaking mechanism which discretely divides the semiconductor wafer by breaking the smiconductor wafer an expanding mechanism for expanding the first holding member to widen gaps of semiconductor elements of the discretely divided semiconductor wafer, the expanding mechanism comprising a heating section for heating the first holding member when expanding the first holding member so that gaps between each semiconductor element are equal to or greater than 10 µm; a second affixing mechanism which affixes a second holding member to the element forming surface side of the semiconductor wafer; a peeling mechanism which peels the first holding member; and a grinding apparatus for grinding a rear surface side of an element forming surface of the discretely divided semiconductor wafer to a predetermined thickness.

According to another aspect of the present invention, there is provided a method for manufacturing a semiconductor device comprising affixing a first holding member to a rear surface of a semiconductor wafer, which is opposite to an element forming surface thereof; dividing the semiconductor wafer into discrete semiconductor elements by breaking the semiconductor wafer; expanding the first holding member in a heated state to widen gaps between the discrete semiconductor elements of the divided semiconductor wafer, so that gaps between each semiconductor element are equal to or greater than 10 µm; affixing a second holding member to the element forming surface side of the semiconductor wafer, while maintaining the gaps wide; peeling the first holding member from the divided semiconductor wafer; and grinding a rear surface side of an element forming surface of the divided semiconductor wafer to a predetermined thickness.

BRIEF DESCRIPTION OF THE SEVERAL VIEWS OF THE DRAWING

FIG. 1 is a perspective view showing part of a manufacturing apparatus and part of a manufacturing process, for illustrating a conventional semiconductor device manufacturing apparatus and semiconductor device manufacturing method, FIG. 2 is a perspective view showing a transferring step, for illustrating the conventional semiconductor device manufacturing apparatus and semiconductor device manufacturing method, FIG. 3 is a perspective view showing part of the manufacturing apparatus and part of the manufacturing process, for illustrating another conventional semiconductor device manufacturing apparatus and semiconductor device manufacturing method, FIG. 4 is a perspective view showing a transferring step, for illustrating the other conventional semiconductor device manufacturing apparatus and semiconductor device manufacturing method, FIG. 5 is a perspective view showing a back-side grinding step, for illustrating the other conventional semiconductor device manufacturing apparatus and semiconductor device manufacturing method, FIG. 6 is a perspective view showing part of the manufacturing apparatus and part of the manufacturing process, for illustrating still another conventional semiconductor device manufacturing apparatus and semiconductor device manufacturing method, FIG. 7 is a perspective view showing a transferring step, for illustrating the still another conventional semiconductor device manufacturing apparatus and semiconductor device manufacturing method, FIG. 22A is a perspective view showing part of the manufacturing apparatus and part of the manufacturing process and showing a state in which another adhesive tape is affixed to the element forming surface side of the semiconductor elements, for illustrating the semiconductor device manufacturing apparatus and semiconductor device manufacturing method according to the second embodiment of this invention, FIG. 22B is a cross sectional view of FIG. 22A showing part of the manufacturing apparatus and part of the manufacturing process, for illustrating the semiconductor device manufacturing apparatus and semiconductor device manufacturing method according to the second embodiment of this invention, FIG. 23 is a cross sectional view showing part of the manufacturing apparatus and part of the manufacturing process and showing a state in which the entire surface of the adhesive tape is attracted and held by use of a suction table, for illustrating the semiconductor device manufacturing apparatus and semiconductor device manufacturing method according to the second embodiment of this invention, FIG. 24 is a cross sectional view showing part of the manufacturing apparatus and part of the manufacturing process and showing a process for peeling the adhesive tape affixed to the rear surface side of a semiconductor wafer, for illustrating the semiconductor device manufacturing apparatus and semiconductor device manufacturing method according to the second embodiment of this invention, FIG. 25 is a cross sectional view showing part of the manufacturing apparatus and part of the manufacturing process and showing a state in which peel-off the adhesive tape is completed, for illustrating the semiconductor device manufacturing apparatus and semiconductor device manufacturing method according to the second embodiment of this invention, FIG. 36 is a cross sectional view showing a second step of peeling the adhesive tape, for illustrating the semiconductor device manufacturing apparatus and semiconductor device manufacturing method according to the fifth modification of this invention, FIG. 37 is a cross sectional view showing a third step of peeling the adhesive tape, for illustrating the semiconductor device manufacturing apparatus and semiconductor device manufacturing method according to the fifth modification of this invention, FIG. 38 is a cross sectional view showing a fourth step of peeling the adhesive tape, for illustrating the semiconductor device manufacturing apparatus and semiconductor device manufacturing method according to the fifth modification of this invention.

DETAILED DESCRIPTION OF THE INVENTION

[First Embodiment]

FIGS. 12A, 12B, 13A, 13B, 14A, 14B and 15 to 18 are views which sequentially show parts of a manufacturing apparatus and parts of a manufacturing method, for illustrating a semiconductor device manufacturing apparatus and semiconductor device manufacturing method according to a first embodiment of this invention.

Figure 8A:
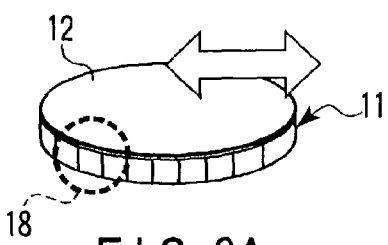
FIG. 8A is a perspective view for illustrating a problem occurring in the transferring step in the conventional semiconductor device manufacturing apparatus and semiconductor device manufacturing method.
Figure 9:
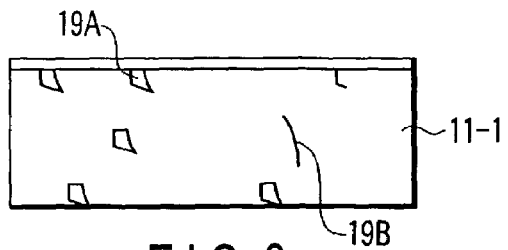
FIG. 9 is a side view showing a semiconductor element formed by use of a conventional semiconductor device manufacturing apparatus and semiconductor device manufacturing method.
Figure 8B:
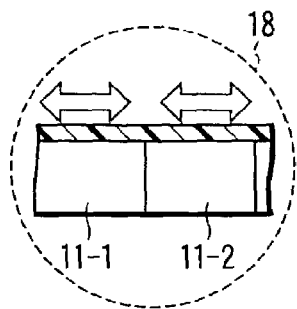
FIG. 8B is an enlarged cross sectional view showing part of FIG. 8A, for illustrating the problem occurring in the transferring step in the conventional semiconductor device manufacturing apparatus and semiconductor device manufacturing method.
Figure 10:
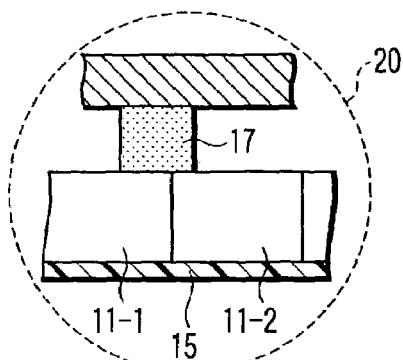
FIG. 10 is an enlarged cross sectional view showing part of FIG. 5, for illustrating the problem occurring in the back-side grinding step in another conventional semiconductor device manufacturing apparatus and semiconductor device manufacturing method.
Figure 11:
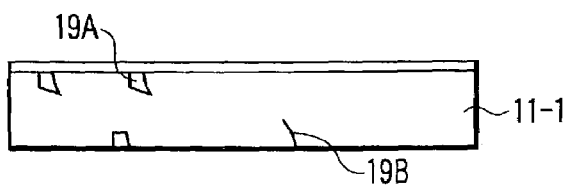
FIG. 11 is a side view showing a semiconductor element formed by use of the other conventional semiconductor device manufacturing apparatus and semiconductor device manufacturing method.
Figure 12A:
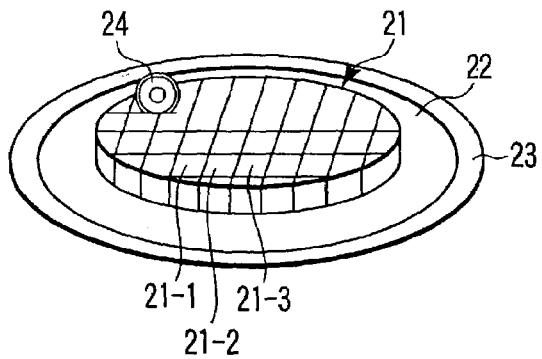
FIG. 12A is a perspective view showing part of the manufacturing apparatus and part of the manufacturing process and showing a state in which a semiconductor wafer is mechanically ground and cut by use of a diamond blade, for illustrating a semiconductor device manufacturing apparatus and semiconductor device manufacturing method according to a first embodiment of this invention.
Figure 12B:
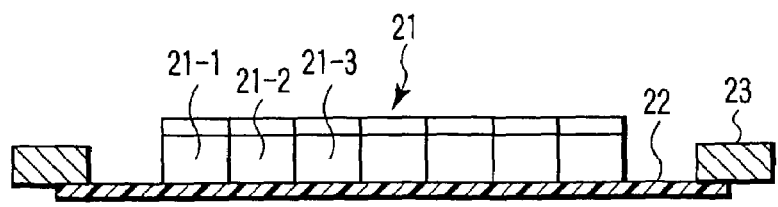
FIG. 12B is a cross sectional view of FIG. 12A showing part of the manufacturing apparatus and part of the manufacturing process, for illustrating the semiconductor device manufacturing apparatus and semiconductor device manufacturing method according to the first embodiment of this invention.

First, as shown in FIGS. 12A and 12B, an adhesive tape (first holding member) 22 for holding is affixed to the rear (or back-side) surface of a semiconductor wafer 21 on which semiconductor elements have been formed. The adhesive tape 22 is equal in size to or larger than the semiconductor wafer 21 and is mounted on a wafer ring 23 so as to be easily handled when it is transferred or mounted on a manufacturing apparatus. Next, the semiconductor wafer 21 is cut and divided into discrete semiconductor elements 21-1, 21-2, 21-3, . . . . In FIG. 12A, a diamond blade 24 is used to mechanically divide the semiconductor wafer by cutting the semiconductor wafer along dicing lines. However, the dividing method is not limited to a mechanically dividing method and can be attained by use of a chemical etching method along chip dividing lines. Further, various methods of a combination of mechanical grinding and chemical etching, grinding and breaking (cleaving), scribing and breaking, cutting by use of a laser scriber, application of laser beam and breaking, and the like can be used to serve the purpose.

Figure 13A:
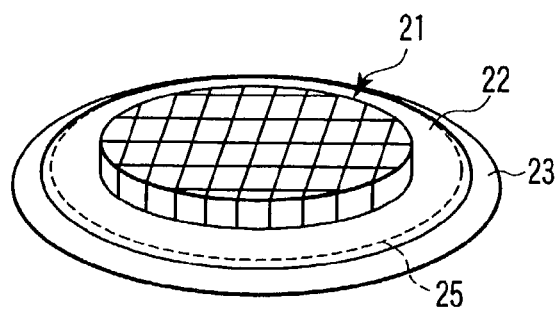
FIG. 13A is a perspective view showing part of the manufacturing apparatus and part of the manufacturing process and showing a state in which a wafer ring is mounted on a jig and an adhesive tape is expanded, for illustrating the semiconductor device manufacturing apparatus and semiconductor device manufacturing method according to the first embodiment of this invention.
Figure 13B:
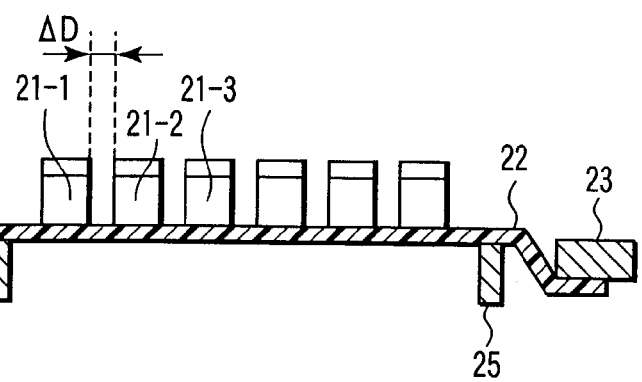
FIG. 13B is a cross sectional view of FIG. 13A showing part of the manufacturing apparatus and part of the manufacturing process, for illustrating the semiconductor device manufacturing apparatus and semiconductor device manufacturing method according to the first embodiment of this invention.

Next, as shown in FIGS. 13A and 13B, the wafer ring 23 is mounted on a tape affixing device and the adhesive tape 22 is expanded by pressing a jig 25 against the adhesive tape so as to widen gaps (distance ΔD) between the discrete semiconductor elements 21-1, 21-2, 21-3, . . . . It is preferable to set the gap size to 10 μm or more.

Figure 14A:
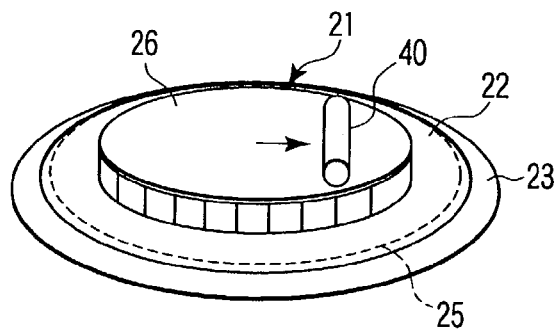
FIG. 14A is a perspective view showing part of the manufacturing apparatus and part of the manufacturing process and showing a state in which another adhesive tape is affixed to the element forming surface side of the semiconductor elements, for illustrating the semiconductor device manufacturing apparatus and semiconductor device manufacturing method according to the first embodiment of this invention.
Figure 14B:
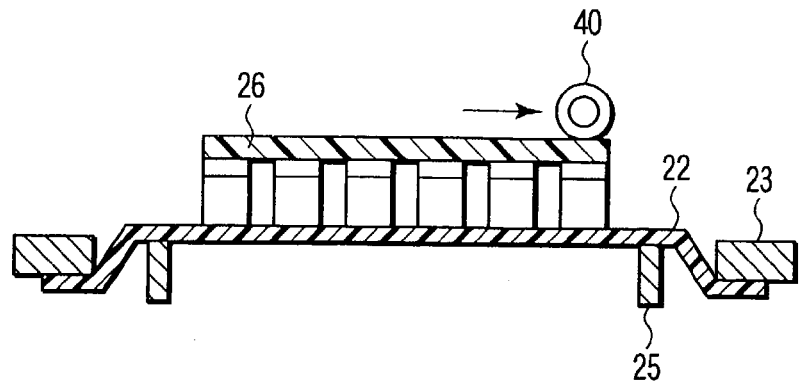
FIG. 14B is a cross sectional view of FIG. 14A showing part of the manufacturing apparatus and part of the manufacturing process, for illustrating the semiconductor device manufacturing apparatus and semiconductor device manufacturing method according to the first embodiment of this invention.

After this, as shown in FIGS. 14A and 14B, an adhesive tape (second holding member) 26 is affixed to the element forming surface (or major surface) of the semiconductor wafer 21 by use of a roller 40, for example, while the gaps of the discretely divided semiconductor elements 21-1, 21-2, 21-3, . . . are kept widened. After the adhesive tape 26 is affixed, it is cut along the outer periphery of the semiconductor wafer 21 by application of laser beam or by use of a cutter. Alternatively, it is also possible to affix an adhesive tape 26 which is previously cut with size corresponding to the size of the semiconductor wafer with the gaps between the semiconductor elements 21-1, 21-2, 21-3, . . . kept widened. When the adhesive tape 26 is cut along the outer periphery of the semiconductor wafer after it is affixed, the adhesive tape can be relatively easily cut by using an auxiliary plate with the same shape and same size as the semiconductor wafer with the gaps kept widened.

Figure 15:
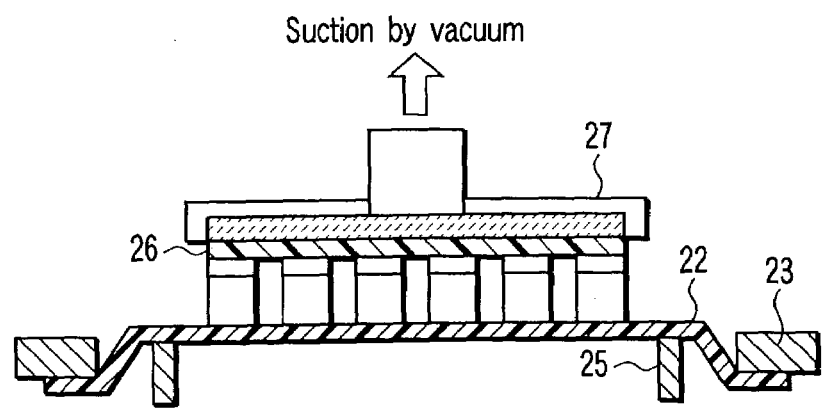
FIG. 15 is a cross sectional view showing part of the manufacturing apparatus and part of the manufacturing process and showing a state in which the entire surface of the adhesive tape is attracted and held by use of a suction table, for illustrating the semiconductor device manufacturing apparatus and semiconductor device manufacturing method according to the first embodiment of this invention.

Next, as shown in FIG. 15, the entire surface of the adhesive tape 26 is attracted and held by use of a suction table 27. The attraction surface portion of the suction table 27 is formed of a porous material and the entire surface of the adhesive tape 26 can be attracted by vacuum suction.

Figure 16:
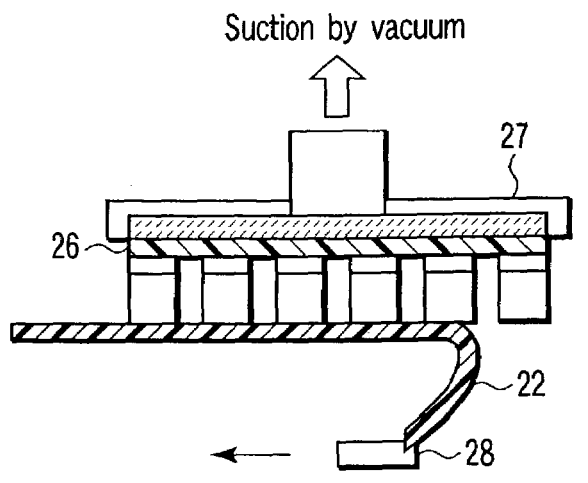
FIG. 16 is a cross sectional view showing part of the manufacturing apparatus and part of the manufacturing process and showing a process for peeling the adhesive tape affixed to the rear surface of a semiconductor wafer, for illustrating the semiconductor device manufacturing apparatus and semiconductor device manufacturing method according to the first embodiment of this invention.
Figure 17:
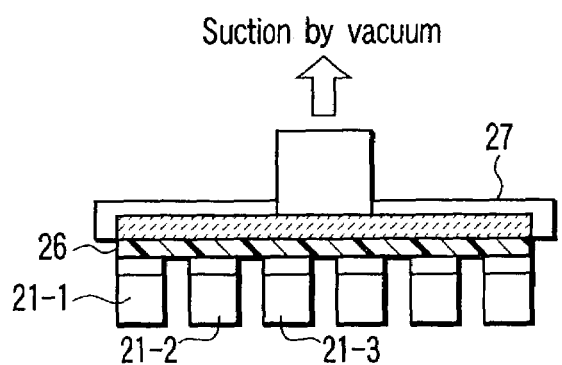
FIG. 17 is a cross sectional view showing part of the manufacturing apparatus and part of the manufacturing process and showing a state in which peel-off the adhesive tape is completed, for illustrating the semiconductor device manufacturing apparatus and semiconductor device manufacturing method according to the first embodiment of this invention.

In this state, as shown in FIG. 16, the adhesive tape 22 affixed to the rear surface side of the discretely divided semiconductor wafer 21 is peeled by pulling the adhesive tape 28 in a direction indicated by an arrow in the drawing by use of a claw 28. After peel-off the adhesive tape 22 is completed, a state in which the discretely divided semiconductor wafer 21 is held by the adhesive tape 26 as shown in FIG. 17 is set up.

Figure 18:
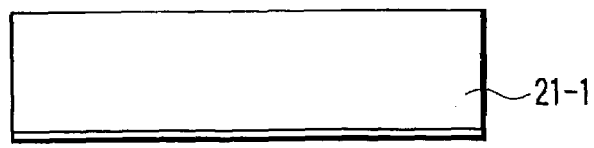
FIG. 18 is a side view showing one picked-up semiconductor element, for illustrating the semiconductor device manufacturing apparatus and semiconductor device manufacturing method according to the first embodiment of this invention.

After this, suction by vacuum is interrupted and the semiconductor elements 21-1, 21-2, 21-3, . . . are sequentially peeled and picked up. FIG. 18 shows a picked-up semiconductor element 21-1 as a typical example.

Then, after the picked-up semiconductor elements 21-1, 21-2, 21-3, . . . are mounted on a lead frame or TAB tape, they are respectively sealed into resin or ceramic packages.

Figure 19A:
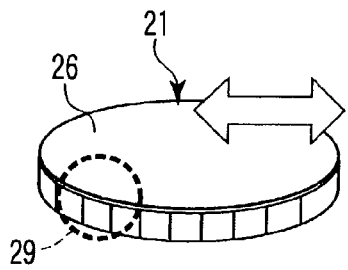
FIG. 19A is a perspective view for illustrating the transferring step in the semiconductor device manufacturing apparatus and semiconductor device manufacturing method according to the first embodiment of this invention.
Figure 19B:
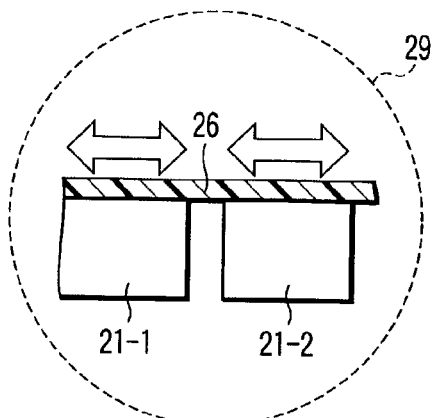
FIG. 19B is a cross sectional view obtained by enlarging part of FIG. 19A, for illustrating the semiconductor device manufacturing apparatus and semiconductor device manufacturing method according to the first embodiment of this invention.

According to the manufacturing method and manufacturing apparatus with the above configuration, as shown in FIGS. 19A and 19B, since the semiconductor wafer can be transferred with the gaps (intervals) between the semiconductor elements 21-1, 21-2, 21-3, . . . kept widened, interference between the semiconductor elements can be suppressed. As a result, occurrence of damages such as chippings and scratches can be suppressed and the quality and manufacturing yield can be enhanced.

[Second Embodiment]

FIGS. 20A, 20B, 21A, 21B, 22A, 22B, 23, 24, 25, 26A, 26B and 27 are views which sequentially show parts of a manufacturing apparatus and parts of a manufacturing method, for illustrating a semiconductor device manufacturing apparatus and semiconductor device manufacturing method according to a second embodiment of this invention.

Figure 20A:
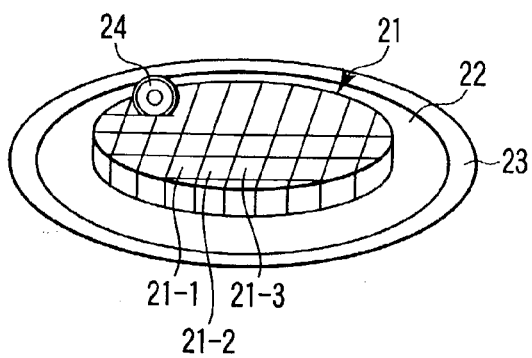
FIG. 20A is a perspective view showing part of a manufacturing apparatus and part of a manufacturing process and showing a state in which a semiconductor wafer is mechanically ground and cut by use of a diamond blade, for illustrating a semiconductor device manufacturing apparatus and semiconductor device manufacturing method according to a second embodiment of this invention.
Figure 20B:
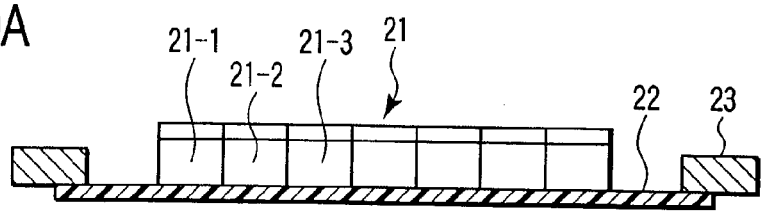
FIG. 20B is a cross sectional view of FIG. 20A showing part of the manufacturing apparatus and part of the manufacturing process, for illustrating the semiconductor device manufacturing apparatus and semiconductor device manufacturing method according to the second embodiment of this invention.

First, as shown in FIGS. 20A and 20B, an adhesive tape (first holding member) 22 for holding is affixed to the rear surface of a semiconductor wafer 21 on which semiconductor elements have been formed. The adhesive tape 22 is equal in size to or larger than the semiconductor wafer 21 and is mounted on a wafer ring 23 or the like so as to be easily handled when it is transferred, for example. Next, the semiconductor wafer 21 is cut and divided into discrete semiconductor elements 21-1, 21-2, 21-3, . . . . In FIG. 20A, a diamond blade 24 is used to mechanically divide the semiconductor wafer by cutting the semiconductor wafer along dicing lines. However, the dividing method is not limited to a mechanically dividing method and can be attained by use of a chemical etching method along chip dividing lines. Further, various methods of a combination of mechanical grinding and chemical etching, grinding and breaking (cleaving), scribing and breaking, cutting by use of a laser scriber, application of laser beam and breaking, and the like can be used to serve the purpose.

Figure 21A:
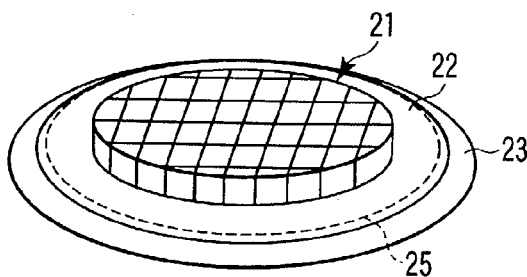
FIG. 21A is a perspective view showing part of the manufacturing apparatus and part of the manufacturing process and showing a state in which a wafer ring is mounted on a jig and an adhesive tape is expanded, for illustrating the semiconductor device manufacturing apparatus and semiconductor device manufacturing method according to the second embodiment of this invention.
Figure 21B:
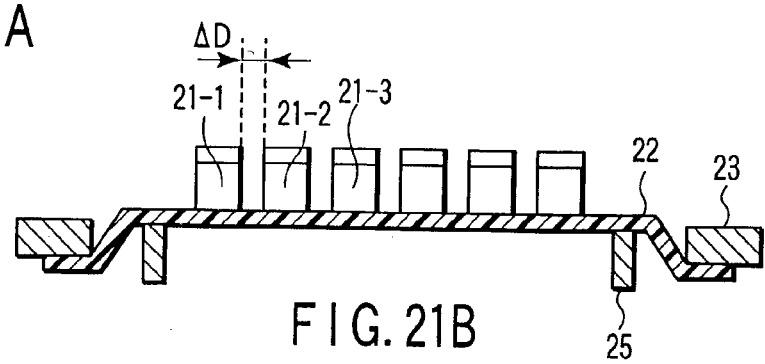
FIG. 21B is a cross sectional view of FIG. 21A showing part of the manufacturing apparatus and part of the manufacturing process, for illustrating the semiconductor device manufacturing apparatus and semiconductor device manufacturing method according to the second embodiment of this invention.

Next, as shown in FIGS. 21A and 21B, the wafer ring 23 is mounted on a tape affixing device and the adhesive tape 22 is pressed against a jig 25 and expanded so as to widen gaps (distance ΔD) between the discrete semiconductor elements 21-1, 21-2, 21-3, . . . . It is preferable to set the gap size to 10 μm or more.

After this, as shown in FIGS. 22A and 22B, an adhesive tape (second holding member) 26 is affixed to the element forming surface side of the semiconductor wafer 21 by use of a roller 40, for example, while the gaps of the discretely divided semiconductor elements 21-1, 21-2, 21-3, . . . are kept widened. After the adhesive tape 26 is affixed, it may be cut along the outer periphery of the semiconductor wafer 21 by application of laser beam or by use of a cutter. Alternatively, it is also possible to affix an adhesive tape 26 which is previously cut with size corresponding to the size of the semiconductor wafer with the gaps of the semiconductor elements 21-1, 21-2, 21-3, . . . kept widened. When the adhesive tape 26 is cut along the outer periphery of the semiconductor wafer after it is affixed, the adhesive tape can be relatively easily cut by using an auxiliary plate with the same shape and same size as the semiconductor wafer with the gaps kept widened.

Next, as shown in FIG. 23, the entire surface of the adhesive tape 26 is attracted and held by use of a suction table 27. The attraction surface portion of the suction table 27 is formed of a porous material and the entire surface of the adhesive tape 26 can be attracted by vacuum suction.

In this state, as shown in FIG. 24, the adhesive tape 22 affixed to the rear surface side of the semiconductor wafer 21 is peeled by pulling the adhesive tape 22 in a direction indicated by an arrow in the drawing by use of a claw 28. After peel-off the adhesive tape 22 is completed, a state in which the discretely divided semiconductor wafer 21 is held by the adhesive tape 26 as shown in FIG. 25 is set up.

After this, suction by vacuum is interrupted and the discretely divided semiconductor wafer 21 is transferred to and set on the table of a grinding attachment.

Figure 26A:
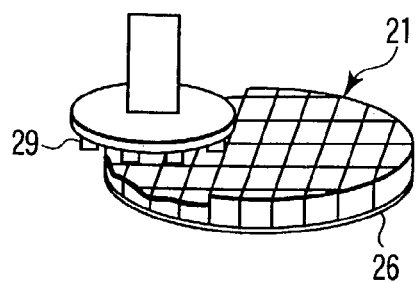
FIG. 26A is a perspective view showing part of the manufacturing apparatus and part of the manufacturing process and showing a back-side grinding step, for illustrating the semiconductor device manufacturing apparatus and semiconductor device manufacturing method according to the second embodiment of this invention.
Figure 26B:
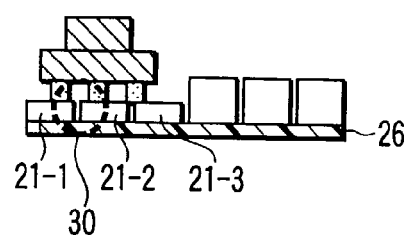
FIG. 26B is a cross sectional view of FIG. 26A showing part of the manufacturing apparatus and part of the manufacturing process, for illustrating the semiconductor device manufacturing apparatus and semiconductor device manufacturing method according to the second embodiment of this invention.
Figure 27:
FIG. 27 is a side view showing one picked-up semiconductor element, for illustrating the semiconductor device manufacturing apparatus and semiconductor device manufacturing method according to the second embodiment of this invention.

Then, as shown in FIGS. 26A and 26B, the rear surface of the semiconductor wafer 21 is ground by use of a grindstone and polished by use of free adhesive grains until the semiconductor wafer is made thin to preset thickness and thus a semiconductor element 21-1 as shown in FIG. 27 is formed. If necessary, an etching process (dry etching, wet etching, gas etching, CMP or the like) can be performed to remove scratches formed on the grinding surface after the back-side grinding process. Of course, the semiconductor wafer can be finished with preset thickness only by etching without using the mechanical grinding and polishing processes.

Then, after the semiconductor elements 21-1, 21-2, 21-3, . . . picked up from the adhesive tape 26 are mounted on a lead frame or TAB tape, they are respectively sealed into resin or ceramic packages.

Figure 28:
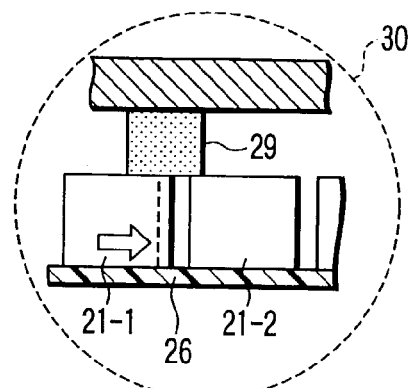
FIG. 28 is a cross sectional view obtained by enlarging part of FIG. 26B, for illustrating the transferring step in the semiconductor device manufacturing apparatus and semiconductor device manufacturing method according to the second embodiment of this invention.

According to the manufacturing method and manufacturing apparatus with the above configuration, as shown in FIG. 25, since the semiconductor wafer can be transferred with the gaps (intervals) between the semiconductor elements 21-1, 21-2, 21-3, . . . kept widened, interference between the semiconductor elements 21-1, 21-2, 21-3, . . . at the time of transferring to the back-side grinding process can be suppressed. As shown in FIG. 28 in which an area surrounded by broken lines 30 in FIG. 26B is shown in an enlarged form, interference between the semiconductor elements can be suppressed because of the presence of the gaps even when the semiconductor elements 21-1, 21-2, 21-3, . . . are shifted in a direction indicated by an arrow at the time of back-side grinding. Therefore, occurrence of damages such as chippings and scratches can be further suppressed and the quality and manufacturing yield can be enhanced.

[Modification 1]

Figure 29:
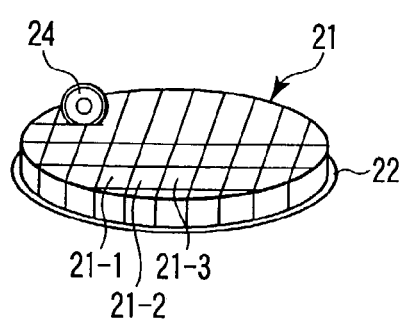
FIG. 29 is a perspective view showing a dividing step of a semiconductor wafer, for illustrating a semiconductor device manufacturing apparatus and semiconductor device manufacturing method according to a first modification of this invention.
Figure 30:
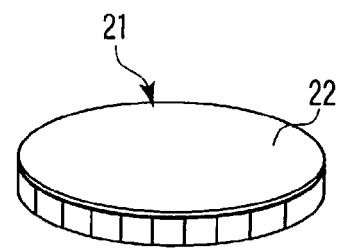
FIG. 30 is a perspective view showing a transferring step of the semiconductor wafer, for illustrating the semiconductor device manufacturing apparatus and semiconductor device manufacturing method according to the first modification of this invention.

In the first and second embodiments, a case wherein the wafer ring 23 is used is explained as an example. However, the semiconductor wafer 21 can be divided without using the wafer rings 23 as shown in FIG. 29 while the semiconductor wafer 21 is affixed to an adhesive tape 22 with substantially the same shape and same size as the semiconductor wafer 21. Further, the semiconductor wafer can be transferred without using the wafer rings 23 as shown in FIG. 30 while the semiconductor elements 21-1, 21-2, 21-3, . . . are affixed to the adhesive tape 22. The rear surface of the semiconductor elements 21-1, 21-2, 21-3, . . . can be ground after affixing an adhesive tape 22 to the front surface side without using the wafer ring 23.

[Modification 2]

Figure 31:
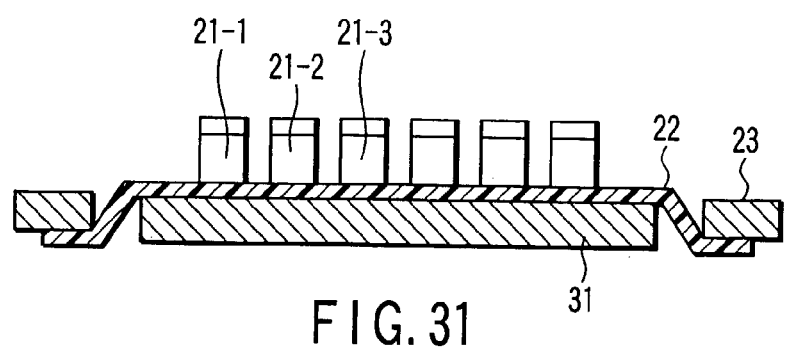
FIG. 31 is a perspective view showing another example of a step of expanding an adhesive tape to widen gaps between semiconductor elements, for illustrating a semiconductor device manufacturing apparatus and semiconductor device manufacturing method according to a second modification of this invention.

FIG. 31 shows another example of the step (refer expanding the adhesive tape 22 to widen the gaps of the semiconductor elements 21-1, 21-2, 21-3, . . . in the first and second embodiments. In this example, when the adhesive tape 22 is expanded, a table 31 is pressed against the adhesive tape instead of the jig 25.

The manufacturing method and manufacturing apparatus with the above configuration are preferable since distortion of the semiconductor elements can be suppressed when the semiconductor elements 21-1, 21-2, 21-3, . . . are large and thin.

[Modification 3]

Figure 32:
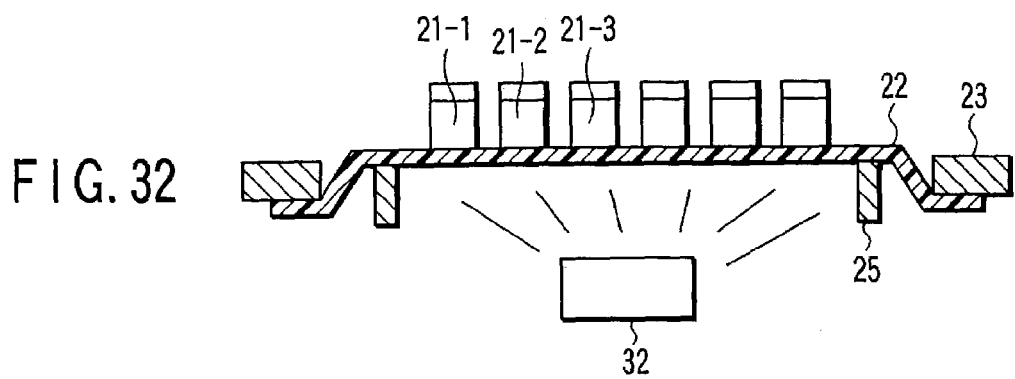
FIG. 32 is a perspective view showing still another example of the step of expanding the adhesive tape to widen the gaps between the semiconductor elements, for illustrating a semiconductor device manufacturing apparatus and semiconductor device manufacturing method according to a third modification of this invention.

FIG. 32 shows still another example of the step of expanding the adhesive tape 22 to widen the gaps of the discretely divided semiconductor elements 21-1, 21-2, . . . in the first and second embodiments. In this example, when the adhesive tape 22 is expanded, hot air is blown from a nozzle 32 to the adhesive tape 22.

The manufacturing method and manufacturing apparatus with the above configuration permit the whole portion of the underside surface of the semiconductor wafer 21 to be warmed and permit the adhesive tape 22 to be easily expanded.

[Modification 4]

Figure 33:
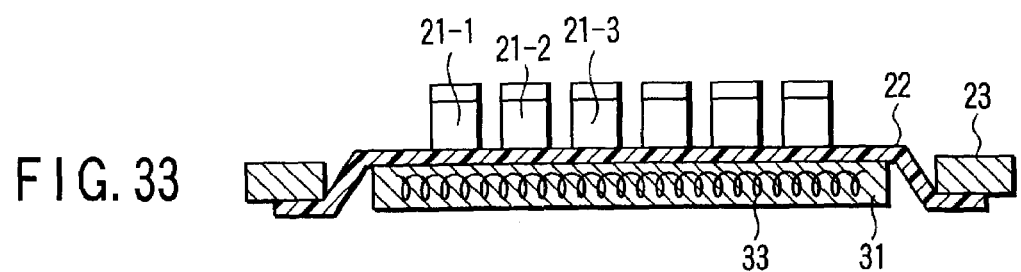
FIG. 33 is a perspective view showing still another example of the step of expanding the adhesive tape to widen the gaps between the semiconductor elements, for illustrating a semiconductor device manufacturing apparatus and semiconductor device manufacturing method according to a fourth modification of this invention.

FIG. 33 shows another example of the step of expanding the adhesive tape 22 to widen the gaps of the discretely divided semiconductor elements 21-1, 21-2, . . . in the first and second embodiments. In this example, when the adhesive tape 22 is expanded, the adhesive tape and semiconductor wafer 21 are heated by use of a heater 33 contained in the table 31.

The manufacturing method and manufacturing apparatus with the above configuration permit the whole underside surface portion of the semiconductor wafer 21 to be warmed and permit the adhesive tape 22 to be easily expanded at the time of expansion of the adhesive tape 22.

[Modification 5]

Figure 34:
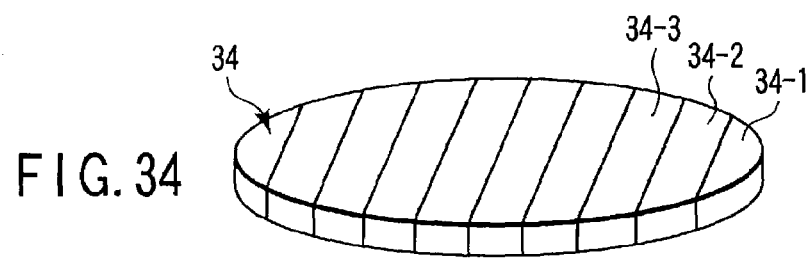
FIG. 34 is a perspective view showing a table used in another example of the step of expanding the adhesive tape to widen the gaps between the semiconductor elements, for illustrating a semiconductor device manufacturing apparatus and semiconductor device manufacturing method according to a fifth modification of this invention.

FIGS. 34 to 38 show another example of the step of affixing the adhesive tapes in the first and second embodiments. FIG. 34 is a perspective view showing a table used when the adhesive tape 22 is expanded. FIGS. 35 to 38 respectively show peeling steps of the adhesive tape. As shown in FIG. 34, a table 34 which presses the adhesive tape 22 is divided into a plurality of blocks 34-1, 34-2, 34-2, . . . .

Figure 35:
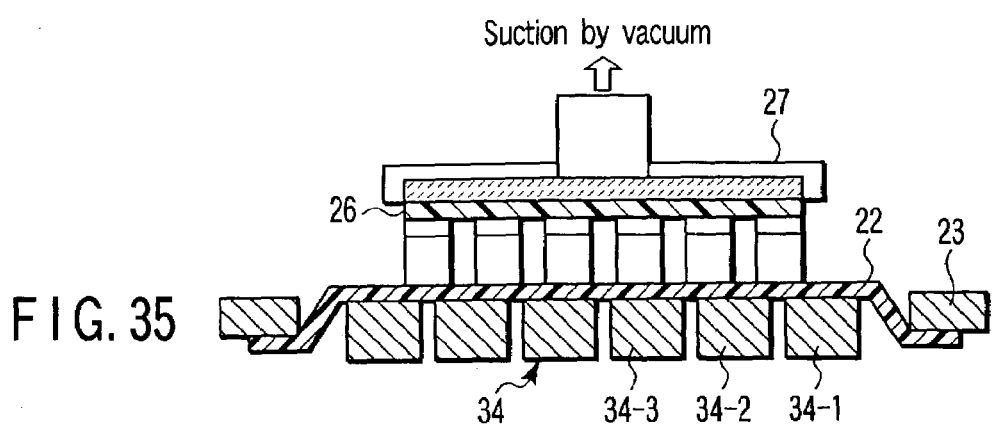
FIG. 35 is a cross sectional view showing a first step of peeling an adhesive tape, for illustrating the semiconductor device manufacturing apparatus and semiconductor device manufacturing method according to the fifth modification of this invention.

Then, as shown in FIG. 35, the whole surface portion of an adhesive tape 26 is attracted and held by use of a suction table 27 while the whole portion of the table 34 is pressed against the adhesive tape 22 so as to widen the gaps of the semiconductor elements 21-1, 21-2, 21-3, . . . .

Next, as shown in FIGS. 36 and 37, the adhesive tape 22 affixed to the rear surface side of the semiconductor wafer 21 is pulled in a direction indicated by an arrow in the drawing and peeled by use of a claw 28. At this time, the blocks 34-1, 34-2, 34-3, . . . of the table 34 are sequentially peeled from the adhesive tape 22 according to the speed at which the adhesive tape 22 is peeled (or according to the position in which the adhesive tape 22 is peeled) and thus the adhesive tape 22 is peeled while the expanding operation by pressing is being released. Then, after peel-off the adhesive tape 22 is completed, a state as shown in FIG. 38 is set up.

After this, suction by vacuum is interrupted and then the same steps as those in the first and second embodiments are performed.

According to the manufacturing method and manufacturing apparatus with the above configuration, the adhesive tape 22 can be effectively peeled.

[Modification 6]

Figure 39:
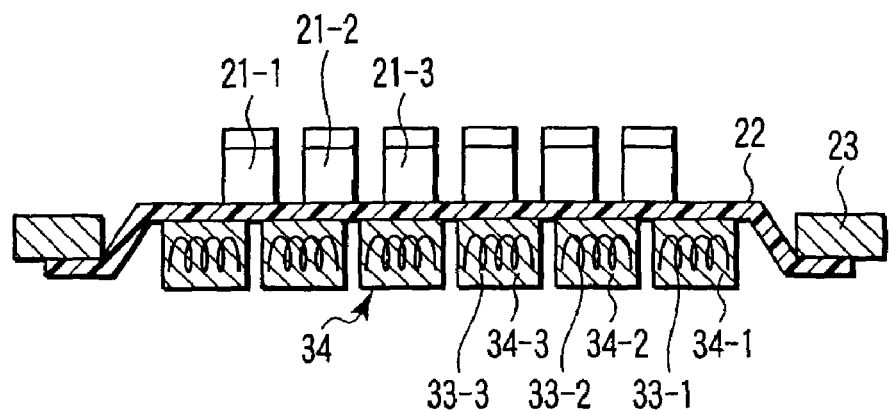
FIG. 39 is a cross sectional view showing still another example of the step of expanding the adhesive tape to widen the gaps between the semiconductor elements, for illustrating a semiconductor device manufacturing apparatus and semiconductor device manufacturing method according to a sixth modification of this invention.

FIG. 39 is a cross sectional view showing the step of expanding the adhesive tape 22, for illustrating still another example of the step of affixing the adhesive tapes in the first and second embodiments. As shown in FIG. 39, heaters 33-1, 33-2, 33-3, . . . are contained in the blocks 34-1, 34-2, 34-3, . . . of the table 34 and the adhesive tape 22 can be heated for each of the blocks 34-1, 34-2, 34-2, . . . . Since the peeling step is the same as that shown in FIGS. 35 to 38 and the succeeding steps are the same as those described in the first and second embodiments, the detail explanation thereof is omitted.

When the adhesive tape 22 is expanded by use of the table 34 with the above configuration, the same effect and operation as those of the first and second embodiments and modifications can be attained.

[Modification 7]

Figure 40A:
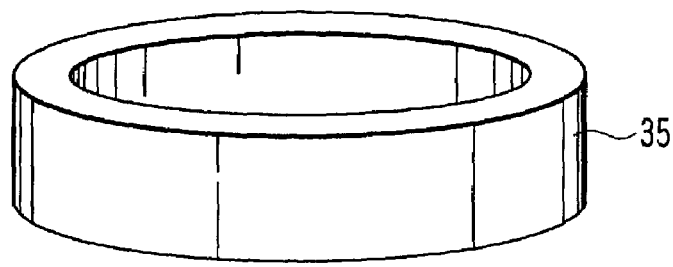
FIG. 40A is a perspective view showing a table used in another example of the step of expanding the adhesive tape to widen the gaps between the semiconductor elements, for illustrating a semiconductor device manufacturing apparatus and semiconductor device manufacturing method according to a seventh modification of this invention.
Figure 40B:
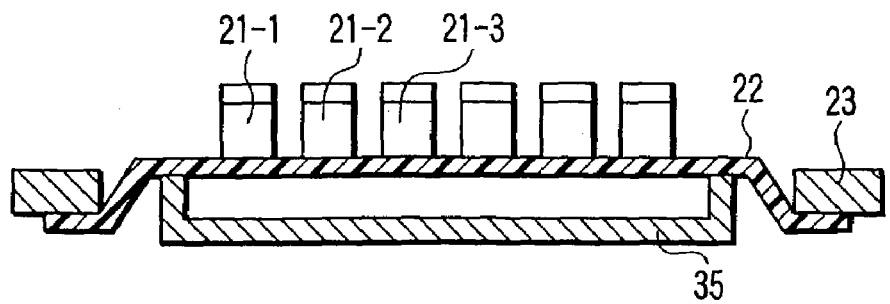
FIG. 40B is a cross sectional view showing the step of expanding the adhesive tape to widen the gaps between the semiconductor elements by use of the table shown in FIG. 40A, for illustrating the semiconductor device manufacturing apparatus and semiconductor device manufacturing method according to the seventh modification of this invention.

FIG. 40A is a perspective view showing a table used when the adhesive tape 22 is expanded. The table 35 has a concave portion at the center, and as shown in FIG. 40B, the table is used to press the peripheral portion of the semiconductor wafer 21 in a ring form with the adhesive tape 22 disposed therebetween.

When the adhesive tape 22 is expanded by use of the table 35 with the above configuration, the same effect and operation as those of the first and second embodiments and modifications can be attained.

[Modification 8]

Figure 41A:
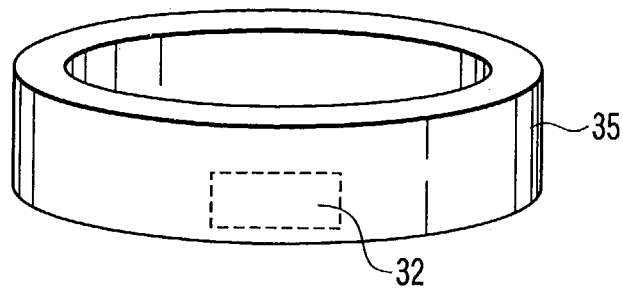
FIG. 41A is a perspective view showing a table used in another example of the step of expanding the adhesive tape to widen the gaps between the semiconductor elements, for illustrating a semiconductor device manufacturing apparatus and semiconductor device manufacturing method according to an eighth modification of this invention.
Figure 41B:
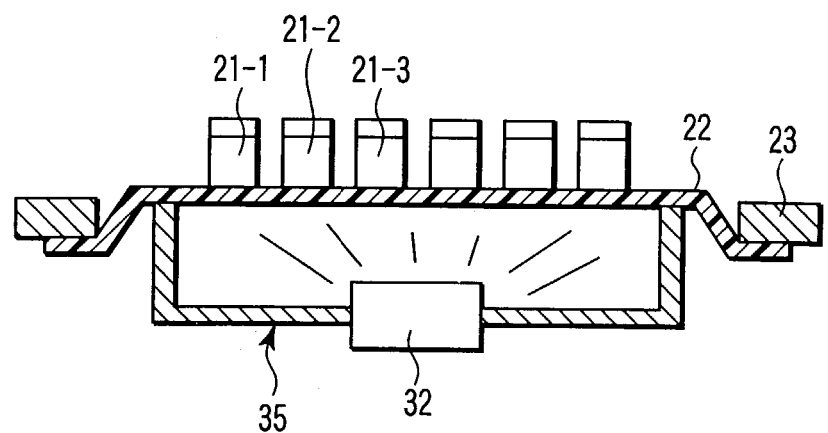
FIG. 41B is a cross sectional view showing the step of expanding the adhesive tape to widen the gaps between the semiconductor elements by use of the table shown in FIG. 41A, for illustrating the semiconductor device manufacturing apparatus and semiconductor device manufacturing method according to the eighth modification of this invention.

FIG. 41A is a perspective view showing a table used when the adhesive tape 22 is expanded. The table 35 has a concave portion at the center, and as shown in FIG. 41B, the table is used to press the peripheral portion of the semiconductor wafer 21 in a ring form with the adhesive tape 22 disposed therebetween. Further, a nozzle 32 which blows hot air to heat the adhesive tape 22 is provided on the bottom portion of the table 35.

When the adhesive tape 22 is expanded by use of the table 35 with the above configuration, the same effect and operation as those of the first and second embodiments and modifications can be attained.

[Modification 9]

Figure 42A:
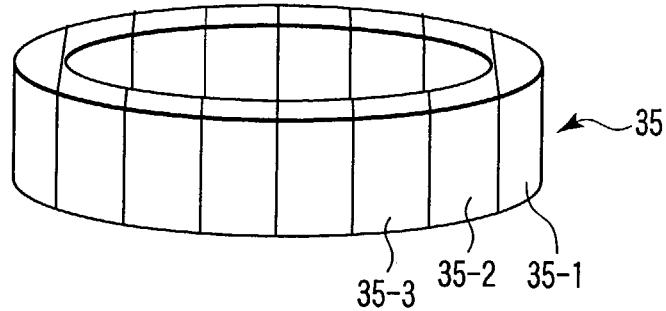
FIG. 42A is a perspective view showing a table used in another example of the step of expanding the adhesive tape to widen the gaps between the semiconductor elements, for illustrating a semiconductor device manufacturing apparatus and semiconductor device manufacturing method according to a ninth modification of this invention.
Figure 42B:
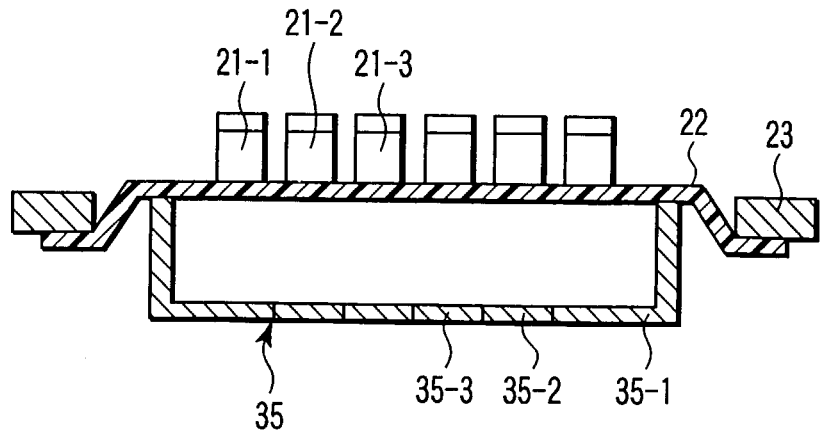
FIG. 42B is a cross sectional view showing the step of expanding the adhesive tape to widen the gaps between the semiconductor elements by use of the table shown in FIG. 42A, for illustrating the semiconductor device manufacturing apparatus and semiconductor device manufacturing method according to the ninth modification of this invention.

FIG. 42A is a perspective view showing a table used when the adhesive tape 22 is expanded. As shown in FIG. 42B, the table 35 is configured to press the peripheral portion of the semiconductor wafer 21 in a ring form with the adhesive tape 22 disposed therebetween. Further, the table 35 is divided into a plurality of blocks 35-1, 35-2, 35-3, . . . .

When the adhesive tape 22 is expanded by use of the table 35 with the above configuration, the same effect and operation as those of the first and second embodiments and modifications can be attained.

[Modification 10]

In the first and second embodiments, a case wherein the adhesive tapes 22, 26 are used as the holding members to hold the discretely divided semiconductor wafer 21 is explained as an example. However, the adhesive tape 22 may be formed of any other member if it is an expandable member which can hold the discretely divided semiconductor wafer 21. Further, it is preferable to use the adhesive tape 22 which is non-shrinkable and various types of plate-like members each having an adhesive layer which holds the discretely divided semiconductor wafer 21 can be used. By adequately selecting the thickness, material and adhesion strength of the adhesive tapes 22, 26 as required, the characteristics of both of the tapes can be set in more preferable conditions.

[Modification 11]

In the first embodiment, the adhesive tape 22 is affixed to the rear surface of the semiconductor wafer 21 and the semiconductor wafer 21 is cut on the element forming surface side. However, it is also possible to affix the adhesive tape 22 to the element forming surface side and cut the semiconductor wafer on the rear surface side. Then, the adhesive tape 26 is affixed to the rear surface side.

In this case, the effect that occurrence of damages such as chippings and scratches can be suppressed and the quality and manufacturing yield can be enhanced can be kept maintained by suppressing interference between the semiconductor elements at the transferring time.

As described above, according to one aspect of this invention, a semiconductor device manufacturing apparatus and semiconductor device manufacturing method can be attained in which occurrence of damages such as chippings and scratches can be suppressed and the quality and manufacturing yield can be enhanced by suppressing interference between the semiconductor elements at the time of transferring or back-side grinding.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An apparatus for manufacturing a semiconductor device comprising:
    a first affixing mechanism which affixes a first holding member to a rear surface of a semiconductor wafer which is opposite to an element forming surface thereof;
    a breaking mechanism which discretely divides the semiconductor wafer by breaking the semiconductor wafer;
    an expanding mechanism for expanding the first holding member to widen gaps of semiconductor elements of the discretely divided semiconductor wafer, the expanding mechanism comprising a heating section for heating the first holding member when expanding the first holding member so that gaps between each semiconductor element are greater than or equal to 10 μm;
    a second affixing mechanism which affixes a second holding member to the element forming surface side of the semiconductor wafer;
    a peeling mechanism which peels the first holding member; and
    a grinding apparatus for grinding a rear surface side of an element forming surface of the discretely divided semiconductor wafer to a predetermined thickness.

2. The apparatus according to claim 1, wherein the second affixing mechanism includes a suction section having a shape and size corresponding to those of the semiconductor wafer and the entire surface of the second holding member is attracted by use of the suction section, and the first holding member is peeled after the second holding member is affixed by use of the second affixing mechanism.

3. The apparatus according to claim 2, wherein an attraction surface portion of the suction section which attracts the second holding member is formed of a porous material.

4. The apparatus according to claim 1, wherein the second affixing mechanism has a jig to expand the first holding member.

5. The apparatus according to claim 1, wherein the second affixing mechanism has a table which presses the semiconductor wafer with the first holding member disposed therebetween to expand the first holding member.

6. The apparatus according to claim 5, wherein the table is divided into a plurality of blocks.

7. The apparatus according to claim 1, wherein the second affixing mechanism has a table which presses a peripheral portion of the semiconductor wafer in a ring form with the first holding member disposed therebetween to expand the first holding member.

8. The apparatus according to claim 7, wherein the table is divided into a plurality of blocks.

9. The apparatus according to claim 1, wherein the heater section blows hot air to the first holding member.

10. The apparatus according to claim 1, wherein the heater section is a heater provided in a table used to press the semiconductor wafer when the first holding member is expanded.

11. The apparatus according to claim 1, further comprising an etching device which etches a grinding surface of the semiconductor wafer after the rear surface side of the discretely divided semiconductor wafer which is opposite to the element forming surface thereof is ground to set the semiconductor wafer to the preset thickness by use of the grinding attachment.

12. The apparatus according to claim 1, wherein the first and second holding members are adhesive tapes.

13. A method for manufacturing a semiconductor device comprising:
    affixing a first holding member to a rear surface of a semiconductor wafer, which is opposite to an element forming surface thereof;
    dividing the semiconductor wafer into discrete semiconductor elements by breaking the semiconductor wafer;
    expanding the first holding member in a heated state to widen gaps between the discrete semiconductor elements of the divided semiconductor wafer, so that gaps between each semiconductor element are greater than or equal to 10 μm;
    affixing a second holding member to the element forming surface side of the semiconductor wafer, while maintaining the gaps wide;
    peeling the first holding member from the divided semiconductor wafer; and
    grinding a rear surface side of an element forming surface of the divided semiconductor wafer to a predetermined thickness.

14. The method according to claim 13, wherein peeling the first holding member is to peel the first holding member while the first holding member with size corresponding to that of the entire surface of the semiconductor wafer is being attracted.

15. The method according to claim 13, wherein peeling the first holding member is performed while an expanding operation of pressing the first holding member to expand the first holding member affixed to the rear surface of the semiconductor wafer which is opposite to the element forming surface thereof and used at the time of cutting is being released according to the progress of a peel process.

16. The method according to claim 13, further comprising etching a grinding surface after grinding the rear surface side of the divided semiconductor wafer which is opposite to the element forming surface thereof to set the semiconductor wafer to the preset thickness.

17. The method according to claim 13, wherein the first and second holding members are adhesive tapes.

* * * * *